United States Patent
Yoon et al.

(10) Patent No.: US 7,863,179 B2
(45) Date of Patent: Jan. 4, 2011

(54) METHODS OF FABRICATING A BARRIER LAYER WITH VARYING COMPOSITION FOR COPPER METALLIZATION

(75) Inventors: Hyungsuk Alexander Yoon, San Jose, CA (US); Fritz Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 103 days.

(21) Appl. No.: 11/591,310

(22) Filed: Oct. 31, 2006

(65) Prior Publication Data

US 2008/0102621 A1     May 1, 2008

(51) Int. Cl.
*H01L 21/4763*     (2006.01)

(52) U.S. Cl. .................... 438/618; 438/622; 438/637; 438/643; 438/653; 438/775

(58) Field of Classification Search ................. 438/618, 438/627, 653, 685, 622, 637, 643, 775; 257/751
See application file for complete search history.

(56) References Cited

U.S. PATENT DOCUMENTS

| | | | |
|---|---|---|---|
| 4,859,552 A | | 8/1989 | Yoshizawa et al. |
| 5,231,306 A | | 7/1993 | Meikle et al. |
| 6,306,758 B1 | | 10/2001 | Park |
| 6,337,151 B1 * | | 1/2002 | Uzoh et al. ............. 428/698 |
| 6,933,225 B2 * | | 8/2005 | Werkhoven et al. ......... 438/627 |
| 2004/0084680 A1 * | | 5/2004 | Ruelke et al. ............. 257/77 |
| 2005/0156316 A1 * | | 7/2005 | Lee et al. ............... 257/751 |
| 2005/0164487 A1 * | | 7/2005 | Seutter et al. ............. 438/618 |
| 2006/0240187 A1 | | 10/2006 | Weidman |
| 2007/0059913 A1 * | | 3/2007 | King et al. ............. 438/597 |

OTHER PUBLICATIONS

International Search Report, 2 pages.

* cited by examiner

*Primary Examiner*—David Vu
*Assistant Examiner*—Suberr Chi
(74) *Attorney, Agent, or Firm*—Martine Penilla & Gencarella, LLP

(57) ABSTRACT

Various embodiments provide improved processes and systems that produce a barrier layer with decreasing nitrogen concentration with the increase of film thickness. A barrier layer with decreasing nitrogen concentration with film thickness allows the end of barrier layer with high nitrogen concentration to have good adhesion with a dielectric layer and the end of barrier layer with low nitrogen concentration (or metal-rich) to have good adhesion with copper. An exemplary method of depositing a barrier layer on an interconnect structure is provided. The method includes (a) providing an atomic layer deposition environment, (b) depositing a barrier layer on the interconnect structure with a first nitrogen concentration during a first phase of deposition in the atomic layer deposition environment. The method further includes (c) continuing the deposition of the barrier layer on the interconnect structure with a second nitrogen concentration during a second phase deposition in the atomic layer deposition environment.

26 Claims, 16 Drawing Sheets

METHODS OF FABRICATING A BARRIER LAYER WITH VARYING COMPOSITION FOR COPPER METALLIZATION

BACKGROUND

Integrated circuits use conductive interconnects to wire together the individual devices on a semiconductor substrate, or to communicate externally to the integrated circuit. Interconnect metallization for vias and trenches may include aluminum alloys and copper. As device geometry continued to scale down to 45-nm-node technology and sub-45-nm technology, the requirement of continuous barrier/seed layer with good step coverage along high aspect ratio geometry to provide void free copper filling becomes challenging. The motivation to go to ultra thin and conformal barrier in 45-nm-node or sub-45-nm-technology is to reduce the barrier's impact on via and line resistance. However, poor adhesion of copper to the barrier layer could cause delamination between the barrier layer and copper during processing or thermal stressing that poses a concern on electro-migration (EM) and stress-induced voiding.

Barrier overhang 104 near top of the interconnect structure 100, as shown in FIG. 1A, by conventional physical vapor deposition (PVD) process is known to cause copper voids in metal lines or vias during copper gap-fill due to poor step coverage. The limited deposition of barrier material in the lower corners 103, as shown in FIG. 1A, is also a known problem to cause copper diffusion, EM problem, and stress-induced voiding. To ensure sufficient barrier material in the lower corners, sufficient barrier materials need to be deposited in the interconnect structures, which would result in copper voids during copper gap-fill. Therefore, a more conformal barrier deposition is needed.

In addition to step coverage concern, barrier layer, such as tantalum nitride (TaN), adheres well to dielectric layer 150; however, the adhesion between TaN and copper is poor. TaN is a good copper diffusion barrier. In contrast, barrier layer, such as tantalum (Ta), adheres well to copper, but not as well to the dielectric layer. Although it's possible to deposit a TaN layer 111 to line the interconnect structure to allow the TaN to contact the dielectric material 150 and to deposit a Ta layer afterwards for copper 113 to be in contact with Ta 112, as shown in FIG. 1B. The Ta layer acts as a liner layer or a glue layer to copper. However, a two-step process is more complicated and the deposition of the first TaN makes the aspect ratio of the interconnect structure even higher, which worsen the step coverage issue of the following Ta layer.

In view of the foregoing, there is a need for systems and processes that deposit a thin and conformal barrier layer that can yield good adhesion with the dielectric layer surrounding the interconnect structure and also with the copper layer that covers the barrier layer to improve yield and electro-migration performance and to reduce the risk of stress-induce voiding of copper interconnect.

SUMMARY

Broadly speaking, the embodiments fill the need by providing improved processes and systems that produce a barrier layer with decreasing nitrogen concentration with the increase of film thickness. A barrier layer with decreasing nitrogen concentration with film thickness allows the end of barrier layer with high nitrogen concentration to have good adhesion with a dielectric layer and the end of barrier layer with low nitrogen concentration (or metal-rich) to have good adhesion with copper. It should be appreciated that the present invention can be implemented in numerous ways, including as a solution, a method, a process, an apparatus, or a system. Several inventive embodiments of the present invention are described below.

In one embodiment, a method of depositing a barrier layer on an interconnect structure is provided. The method includes (a) providing an atomic layer deposition environment, (b) depositing a barrier layer on the interconnect structure with a first nitrogen concentration during a first phase of deposition in the atomic layer deposition environment. The method further includes (c) continuing the deposition of the barrier layer on the interconnect structure with a second nitrogen concentration during a second phase deposition in the atomic layer deposition environment.

In another embodiment, a method of depositing a metallic barrier layer on an interconnect structure in an atomic layer deposition system is provided. The method includes depositing the metallic barrier layer on the interconnect structure using atomic layer deposition, wherein the nitrogen concentration of the metallic barrier layer decreases with an increase of film thickness.

In yet another embodiment, a method of depositing a metallic barrier layer on an interconnect structure in an atomic layer deposition system is provided. The method includes depositing the metallic barrier layer on the interconnect structure using atomic layer deposition, wherein the nitrogen concentration of the metallic barrier layer decreases step-wide with an increase of film thickness.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Several exemplary embodiments for depositing a metallic barrier layer with decreasing nitrogen concentration from initial deposition to final deposition to improve adhesion between the initial metal nitride barrier layer with dielectric and between the final tantalum barrier layer with copper are provided. It should be appreciated that the present invention can be implemented in numerous ways, including a process, a method, an apparatus, or a system. Several inventive embodiments of the present invention are described below. It will be apparent to those skilled in the art that the present invention may be practiced without some or all of the specific details set forth herein.

Figure 1A:
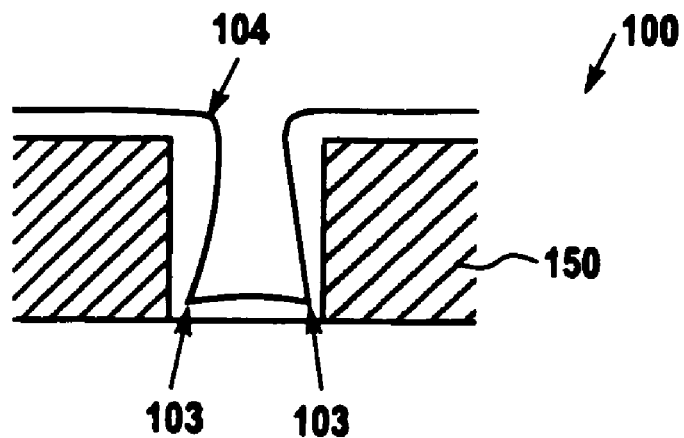
FIG. 1A (Prior Art) shows an interconnect structure deposited with a barrier layer.
Figure 1B:
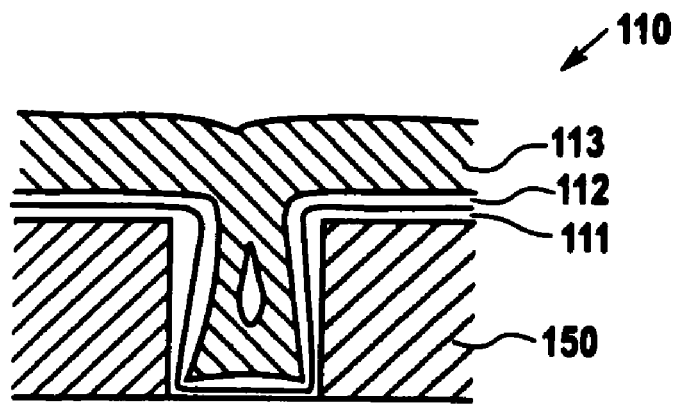
FIG. 1B (Prior Art) shows an interconnect structure deposited a two barrier layer and a copper layer.
Figure 2:
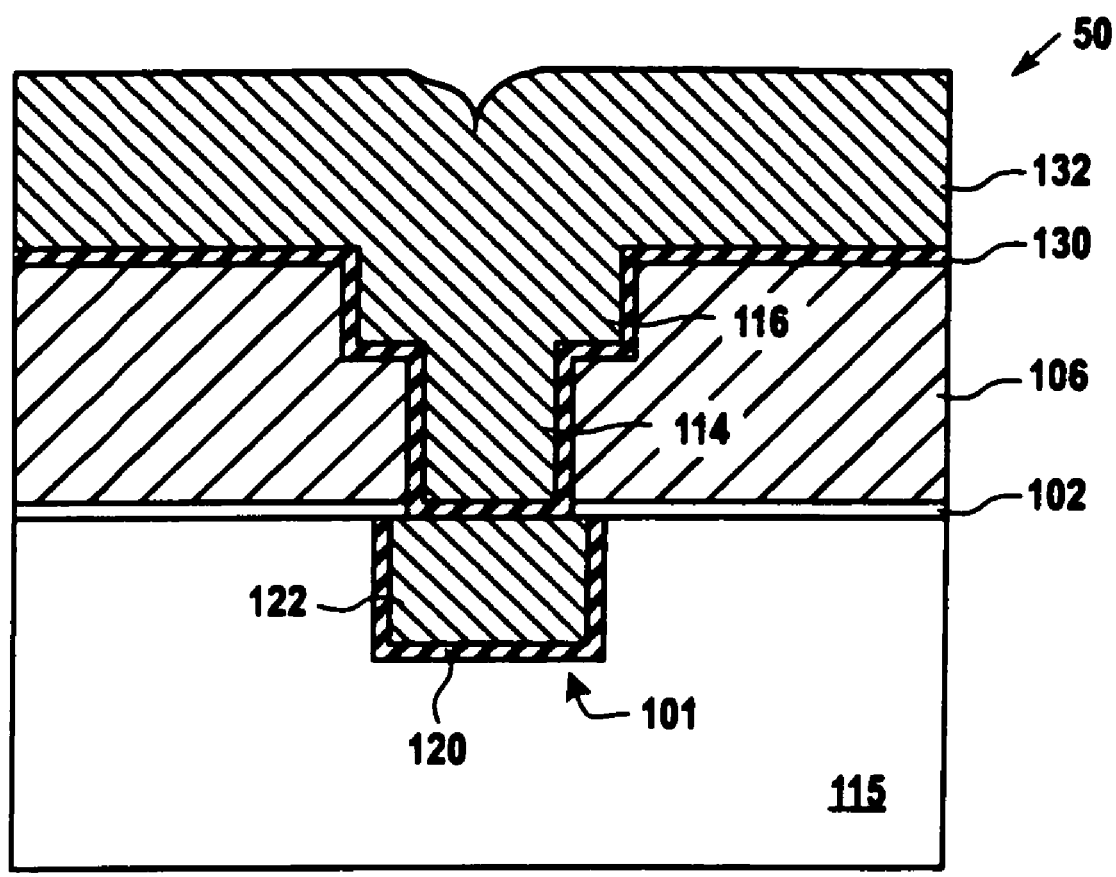
FIG. 2 shows a dual damascene interconnect structure deposited with a barrier layer and a copper layer.

FIG. 2 shows an exemplary cross-section of an interconnect structure(s) after being patterned by using a dual damascene process sequence. The interconnect structure(s) is on a substrate 50 and has a dielectric layer 115, which was previously fabricated to form a metallization line 101 therein. The metallization line is typically fabricated by etching a trench into the dielectric 106 and then filling the trench with a conductive material, such as copper.

In the trench, there is a metallic barrier layer 120, used to prevent the copper material 122, from diffusing into the dielectric 100. The barrier layer 120 can be made of refractory metal compound, such as tantalum nitride (TaN), tantalum (Ta), or a combination of these films. Other barrier layer materials can also be used. Barrier layer materials may be other refractory metal compound including but not limited to titanium (Ti), tungsten (W), zirconium (Zr), hafnium (Hf), molybdenum (Mo), niobium (Nb), vanadium (V), ruthenium (Ru) and chromium (Cr), among others. Conventionally, a refractory metal is combined with reactive species, such as for example chlorine (Cl) or fluorine (F), and is provided with another gas to form a refractory metal compound. For example, titanium tetrachloride ($TiCl_4$), tungsten hexafluoride ($WF_6$), tantalum pentachloride ($TaCl_5$), zirconium tetrachloride ($ZrCl_4$), hafnium tetrachloride ($HfCl_4$), molybdenum pentachloride ($MoCl_5$), niobium pentachloride ($NbCl_5$), vanadium pentachloride ($VCl_5$), or chromium tetrachloride ($CrCl_4$) may be used as a refractory metal-containing compound gas.

A barrier layer 102 is deposited over the planarized copper material 122 to protect the copper material 122 from premature oxidation when via holes 114 are etched through overlying dielectric material 106 to the dielectric barrier layer 102. The dielectric barrier layer 102 is also configured to function as a selective etch stop and a copper diffusion barrier. Exemplary dielectric barrier layer 102 materials include silicon nitride (SiN) or silicon carbide (SiC).

The dielectric layer 106 is deposited over the dielectric barrier layer 102. The dielectric layer 106 can be made of an organo-silicate glass (OSG, carbon-doped silicon oxide) or other types of dielectric materials, preferably with low dielectric constants. Exemplary silicon dioxides can include, a PECVD un-doped TEOS silicon dioxide, a PECVD fluorinated silica glass (FSG), a HDP FSG, OSG, porous OSG, or a carbon-doped oxide (C-oxide). The dielectric constant of the low K dielectric material can be about 3.0 or lower. Commercially available dielectric materials including Black Diamond (I) and Black Diamond (II) by Applied Materials of Santa Clara, Calif., Coral by Novellus Systems of San Jose, Aurora by ASM America Inc. of Phoenix, Ariz., can also be used. Alternatively, the dielectric layer can be divided into a via dielectric layer and a trench dielectric layer. The via dielectric layer and the trench dielectric layer can be made of different materials. After the trench dielectric layer 106 is deposited, the substrate 50 that holds the structure(s) undergoes patterning and etching processes to form the vias holes 114 and trenches 116 by known art.

After the formation of via holes 114 and trenches 116, a barrier layer 130 and a copper layer 132 are deposited to line and fill the via holes 114 and the trenches 116. The barrier layer 130 can be made of refractory metal, such as tantalum nitride (TaN), tantalum (Ta), Ruthenium (Ru), or a hybrid combination of these films. Other barrier layer materials can also be used. Barrier layer materials may be a refractory metal compound including but not limited to titanium (Ti), tungsten (W), zirconium (Zr), hafnium (Hf), molybdenum (Mo), niobium (Nb), vanadium (V), and chromium (Cr), among others. Atomic layer deposition (ALD), pulsed CVD, or cyclic layer deposition processes can be used to achieve good step coverage of the barrier layer. While these are the commonly considered materials, other barrier layer materials can also be used. A copper film 132 is then deposited to fill the via holes 114 and the trenches 116.

After copper film 132 fills the via holes 114 and trenches 116, substrate 50 is planarized by chemical-mechanical polishing (CMP) to remove the copper material (or copper overburden) and barrier layer (or barrier overburden) over the surface of dielectric layer 106. The metallic barrier layer can also be deposited to line a single-damascene contact, via, or a metal structure (not shown).

Figure 3A:
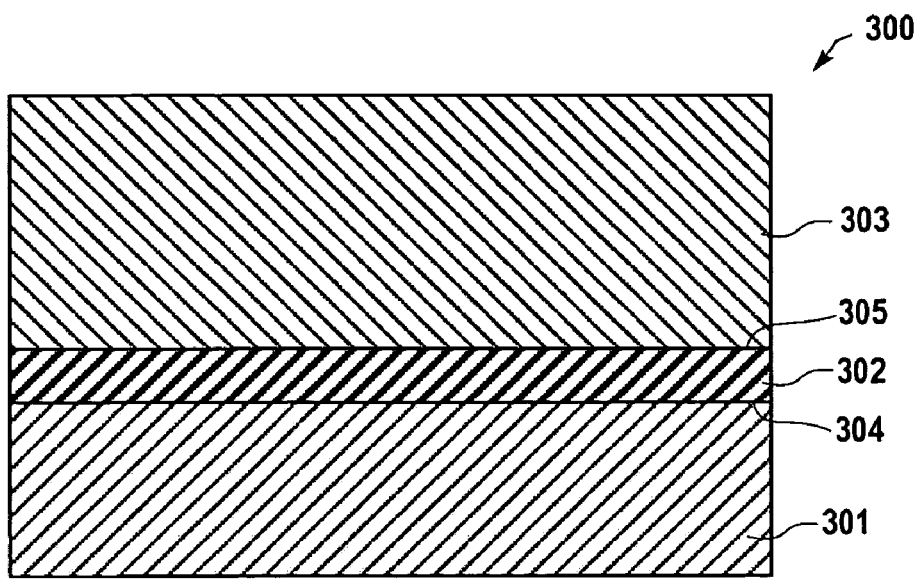
FIG. 3A shows a cross section of an interconnect structure with a barrier layer sandwiched between a dielectric layer and a copper layer.

FIG. 3A shows a schematic cross section 300 of layers of an interconnect structure. A metallic barrier layer 302 is sandwiched between a dielectric layer 301 and a copper layer 303. As described above, the dielectric-barrier interfacial layer 304 needs to be nitrogen-rich to promote good adhesion between the metallic barrier layer 302 and the dielectric layer 301. The barrier-copper interfacial layer 305 needs to be barrier-metal-rich to promote good adhesion between the metallic barrier layer 302 and the copper layer 303. To ensure good step coverage of the barrier layer, the barrier layer is desirable to be deposited by an ALD process, since ALD process produces more conformal films with better step coverage.

Figure 3B:
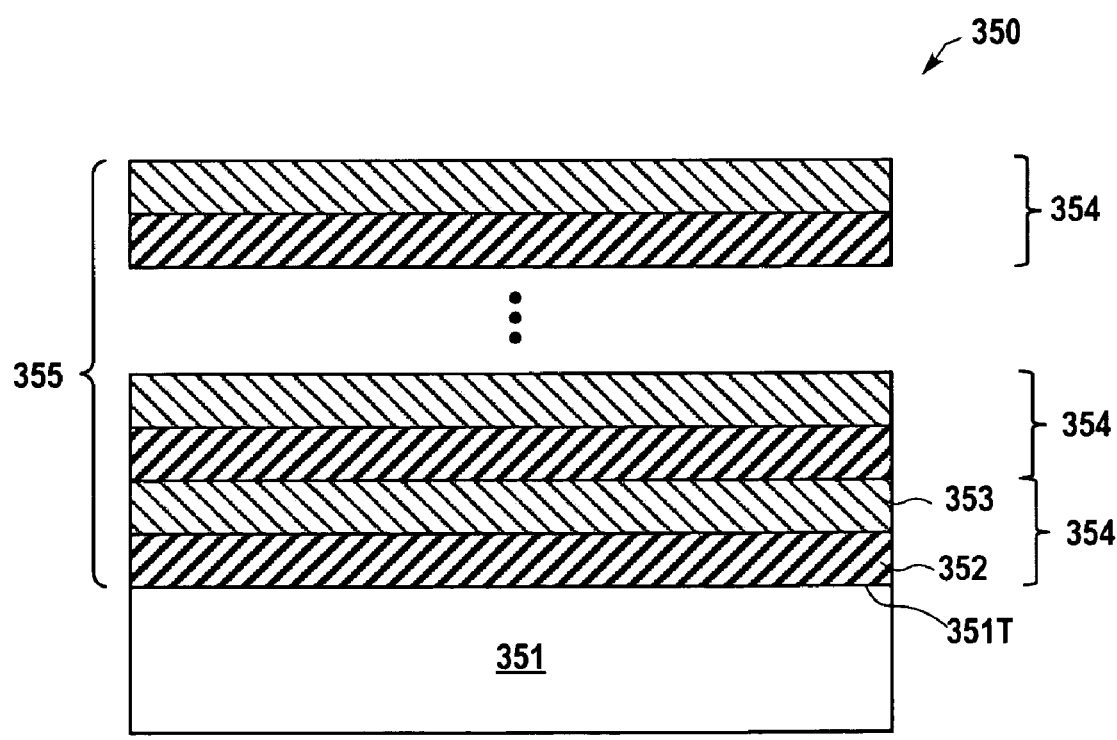
FIG. 3B shows a molecular structure of TaN barrier layer deposited by an ALD process on a substrate surface.

FIG. 3B depicts a cross-sectional view of an exemplary portion of substrate 350 in a stage of integrated circuit fabrication, and more particularly at a stage of barrier layer 355 formation by an ALD process. The exemplary barrier material depicted in FIG. 3B is tantalum nitride. Tantalum layer 352 is formed by chemisorbing a tantalum-containing compound on surface portion 351T of substrate 351 by introducing a pulse of a tantalum-containing gas into an ALD process chamber. Afterwards, a layer 353 of nitrogen is illustratively shown as chemisorbed on tantalum layer 352 at least in part in response to introduction of a nitrogen-containing gas, such as ammonia. While not wishing to be bound by theory, it is believed that nitrogen layer 353 is formed in a similar self-limiting manner, as was tantalum layer 352. Each tantalum layer 352 and nitrogen layer 353 in any combination and in direct contact with one another form a sublayer 354, whether or not either or both or neither is a monolayer. The formation of sublayers 354 continues until a targeted thickness 355 is reached.

Figure 3C:
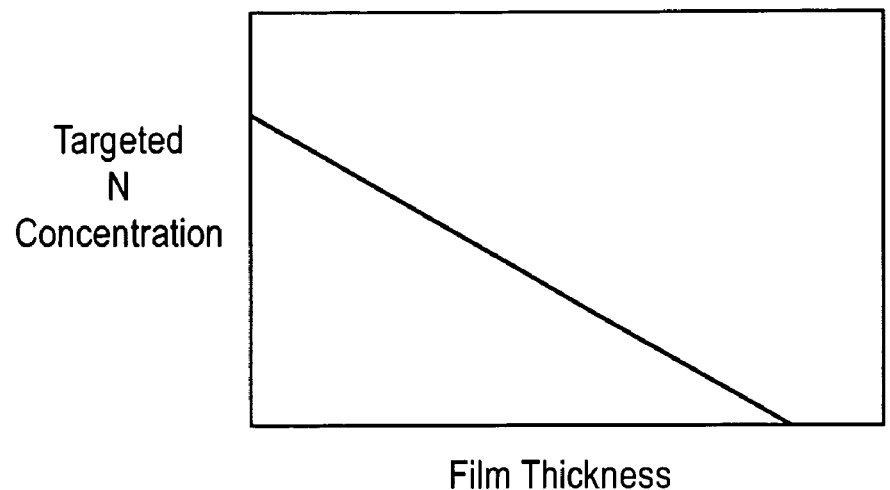
FIG. 3C shows a barrier layer with continuously decreasing nitrogen concentration with increase of film thickness
Figure 3D:
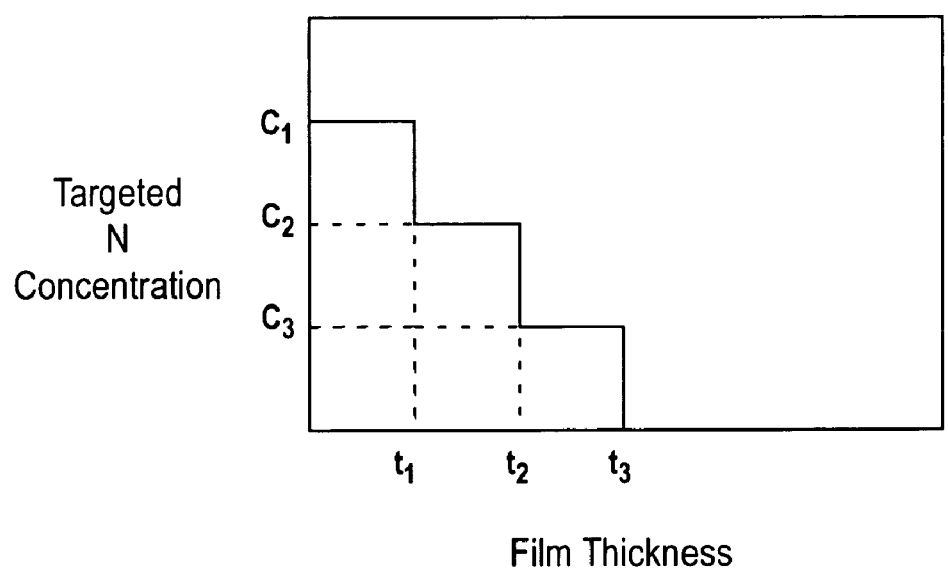
FIG. 3D shows a barrier layer with step-wise decreasing nitrogen concentration with increase of film thickness.

The nitrogen concentration in the barrier layer can continuously varying, as shown in FIG. 3C, or step-wise decreasing with the thickness of the metallic barrier layer, as shown in FIG. 3D. FIG. 3D shows that the nitrogen concentration decreases with film thickness in three steps. However, the number of steps could be two or greater than three. When the steps in FIG. 3D is numerous, the nitrogen variation pattern approaches the nitrogen concentration profile of FIG. 3C.

Figure 4:
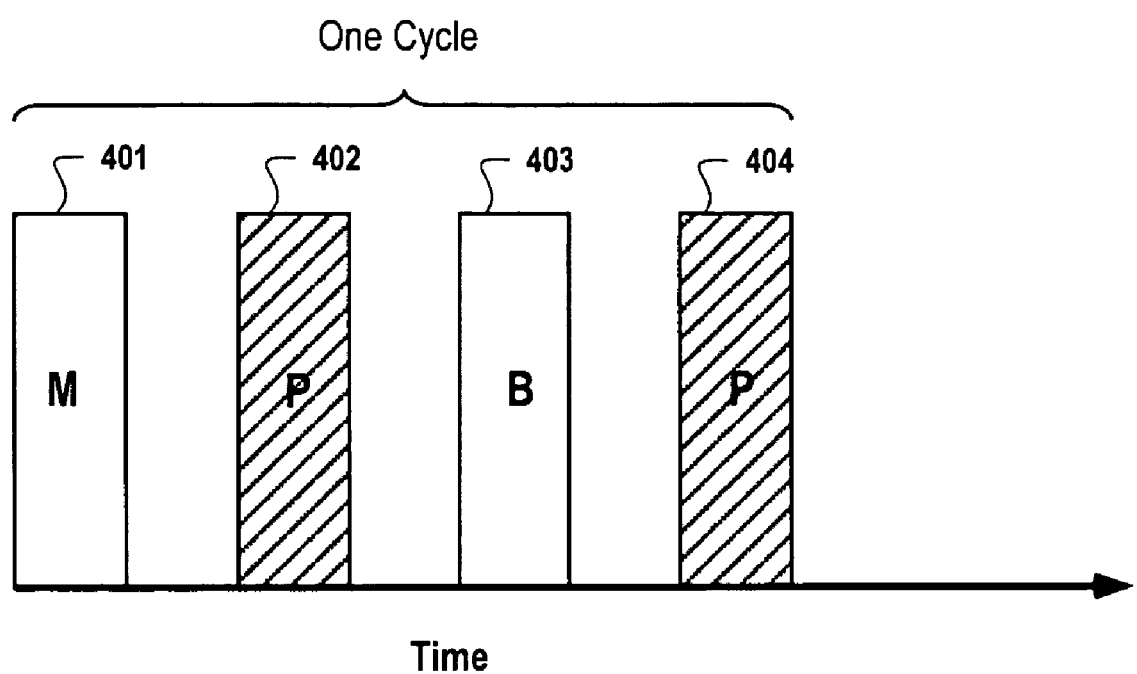
FIG. 4 shows an exemplary ALD deposition cycle.

ALD deposition is typically accomplished by using multiple pulses, such as two pulses, of reactants with purge in between, as shown in FIG. 4. For metallic barrier deposition, a pulse of barrier-metal-containing reactant (M) 401 is delivered to the substrate surface, followed by a pulse of purging gas (P) 402. Examples of barrier-metal-containing reactant for barrier metal such as tantalum include but are not limited to pentaethylmethylamino-tantalum (PEMAT; $Ta(NC_2H_5CH_3)_5$), pentadiethylamino-tantalum (PDEAT, $Ta[N(C_2H_5)_2]_5$), pentadimethylamino-tantalum (PDMAT, $Ta[N(CH_3)_2]_5$), and any and all of derivatives of PEMAT, PDEAT, or PDMAT. Other tantalum containing precursors include without limitation tertbutylimido-tris(diethylamido)-tantalum (TBTDET), tertbutylimido-tris(dimethylamido)-tantalum (TBTDMT), and tertbutylimido-tris(ethylmethylamido)-tantalum (TBTEMT), and all of derivatives of TBTDET, TBTDMT, and TBTEMT. Additionally, other tantalum containing precursors include without limitation tantalum halides for example $TaX_5$ where X is fluorine (F), bromine (Br) or chlorine (Cl), and derivatives thereof. Examples of purging gas include helium (He), neon (Ne), argon (Ar), hydrogen ($H_2$), nitrogen ($N_2$), and combinations thereof. The pulse of barrier-containing reactant 401 delivered to the substrate surface form a monolayer of barrier metal, such as Ta, on the substrate surface. In one embodiment, the pulse of purging gas is a plasma enhanced (or plasma assisted) gas. The barrier metal, such as Ta, bonds to the substrate surface which is made of dielectric material. The purge gas 402 removes the excess barrier-metal-containing reactant 401 from the substrate surface. Following the pulse of the purging gas 402, a pulse of reactant (B) 403 is delivered to the substrate surface. The reactant (B) 403 can be nitrogen-containing gas or a hydrogen-containing reducing gas. If the barrier material contains nitrogen, such as TaN, the reactant (B) 403 is likely to contain nitrogen. Examples of reactant (B) 403 include ammonia ($NH_3$), $N_2$, and NO. Other N-containing precursors gases may be used including but not limited to $N_xH_y$ for x and y integers (e.g., $N_2H_4$), $N_2$ plasma source, $NH_2N(CH_3)_2$, among others. If the barrier material contains little or no nitrogen, the reactant (B) 403 can be a hydrogen-containing reducing gas, such as $H_2$. In one embodiment, the pulse of reactant (B) 403 is a plasma-enhanced (or plasma-assisted). Following pulse 403 is a pulse of purging gas 404. FIG. 4 shows one cycle of the barrier deposition pulses. After one cycle of the barrier deposition pulses, a thin layer (or phase) of barrier layer is deposited. Multiple cycles of pulses are applied until desired barrier layer thickness is achieved. The duration of the pulses is between about 100 mili-seconds to about 2 seconds. The total thickness of the barrier layer is between about 10 angstroms to about 50 angstroms, preferably between about 20 angstroms to about 30 angstroms.

Figure 5A:
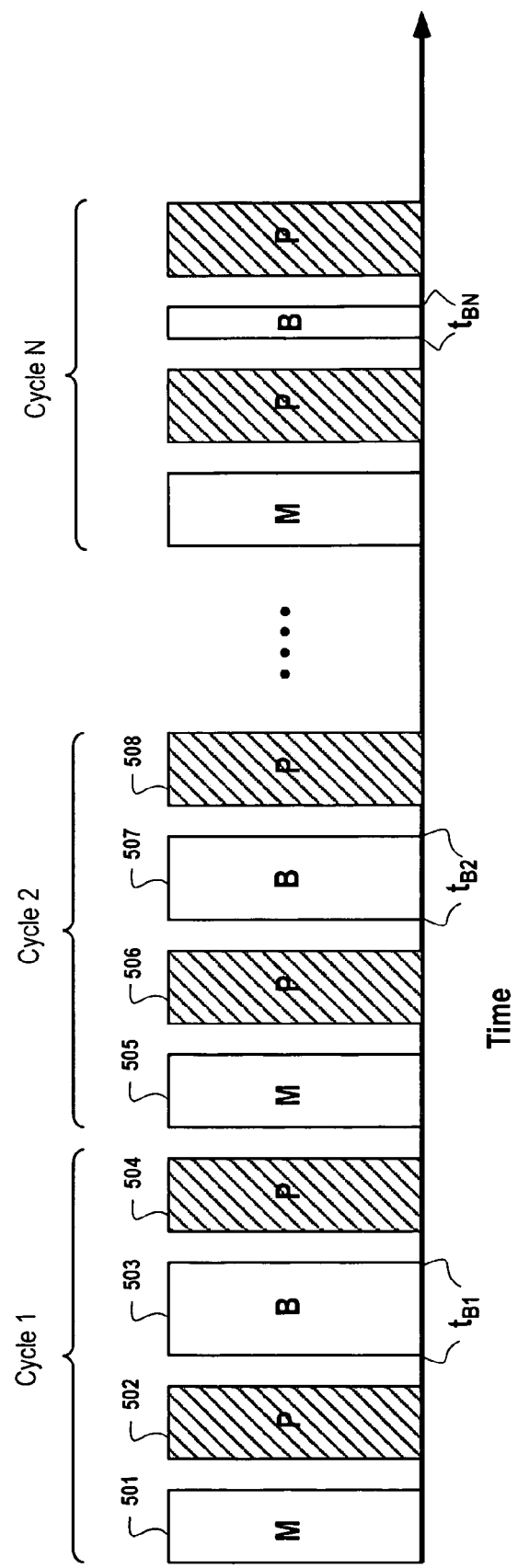
FIG. 5A shows an exemplary deposition pulse sequence of an ALD barrier layer with continuously decreasing nitrogen concentration with increase of film thickness.

FIG. 5A shows an embodiment of pulses of reactants and purging gases as a function of time to achieve continuously decreasing nitrogen content in the barrier layer as shown in FIG. 3C.

The deposition process starts by applying a pulse of barrier-metal-containing reactant (M) 501 on the substrate surface. Pulse 501 is followed by a pulse 502 of a purging gas (P) to remove excess barrier-metal-containing reactant 501 from the substrate surface. Afterwards, a pulse of reactant gas (B) is applied. Since the nitrogen content of the barrier metal layer decreases with film thickness, the reactant gas (B) used for pulse 503 should contain nitrogen. The reactant in pulse 503 react with the barrier-metal-containing reactant (M) on the substrate surface to form a metal nitride barrier layer, such as TaN. The examples of the nitrogen-containing gas include ammonia ($NH_3$), nitrogen ($N_2$), and nitrogen oxide (NO), and other nitrogen-containing reactant B described above. Pulses 501, 502, 503 and 504 constitute one cycle (cycle 1). The second cycle includes pulses 505, 506, 507, and 508. Pulse 505 is identical to pulse 501. Pulse 506 is identical to pulse 502. Pulse 508 is identical to pulse 504. Pulse 507 uses the same reactant as pulse 503, however, the duration of pulse 507 ($t_{B2}$) is shorter than pulse 503 ($t_{B1}$). The shorter pulse of the nitrogen-containing gas B makes the concentration of nitrogen in the barrier layer lower. The cycles continue to cycle N. In order for the concentration of nitrogen to decrease from cycle 1 to cycle 2 and continuing to cycle N, the pulse of reactant B from cycle 2 continuing to cycle N should not saturate (or under-saturate) the substrate surface. The duration of pulse with reactant B continues to decrease with each cycle to result in the nitrogen concentration in the deposited barrier layer. At the end of cycle N, the barrier layer reaches its targeted thickness. In one embodiment, the duration of the pulse with reactant B is zero second to make the top barrier surface metal-rich.

As described above, pulses with reactant B and purging gas P can be plasma enhanced. The plasma enhanced purging gas can densify the barrier layer and also can knock off the excess molecules attached to the barrier metal. For example, the M precursor PDMAT is a large molecules with chemical compound attached to the Ta molecule. The chemical compound can stay attached to Ta after Ta is chemisorbed on the substrate surface. The plasma of the purging gas or the reactant B can knock off the excessive molecules attached to the Ta to assist in the reaction of reactant B with Ta.

In one embodiment, there is a final plasma treatment to further reduce surface compound to be more metal-rich. The reducing plasma can include gas, such as hydrogen or ammonia. The reducing plasma can include an inert gas, such as Ar, or He. This final plasma treatment can also densify the barrier layer. In another embodiment, after the deposition cycles in the ALD process chamber, the substrate can be moved to a PVD process chamber for depositing a thin barrier metal layer, which is called a barrier metal flash. For example, if the barrier metal is Ta, the process is called Ta flash. This allows the top barrier surface to be Ta, which adhere well to copper.

Figure 5B:
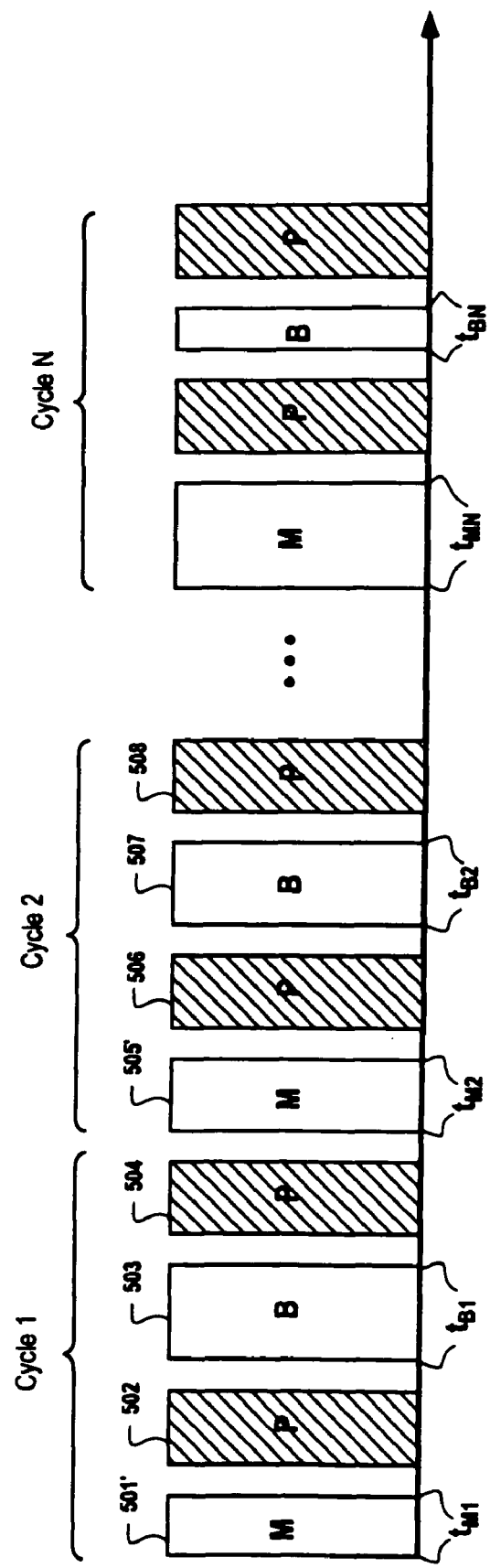
FIG. 5B shows another exemplary deposition pulse sequence of an ALD barrier layer with continuously decreasing nitrogen concentration with increase of film thickness.

Alternatively, the duration of the pulses of barrier-metal-containing reactant M increase with time, while the duration of the pulses of the nitrogen-containing gas B decrease with time, as shown in FIG. 5B. The duration $t_{M2}$ of pulse 505' is longer than duration $t_{M1}$ of pulse 501', while the duration $t_{B2}$ of pulse 507 is shorter than the duration $t_{B1}$ of pulse 503. The longer pulse of the barrier-metal-containing reactant M and shorter pulse of the nitrogen-containing gas B makes the concentration of nitrogen in the barrier layer deposited in cycle 2 lower than the nitrogen concentration in cycle 1. The cycles continue to cycle N. The duration of pulse with M continues to increase and the duration of pulse with reactant B continues to decrease with each cycle to result in the nitrogen concentration in the deposited barrier layer. At the end of cycle N, the barrier layer reaches its targeted thickness. In one embodiment, the duration of the pulse with reactant B is zero second to make the top barrier surface metal-rich.

Figure 5C:
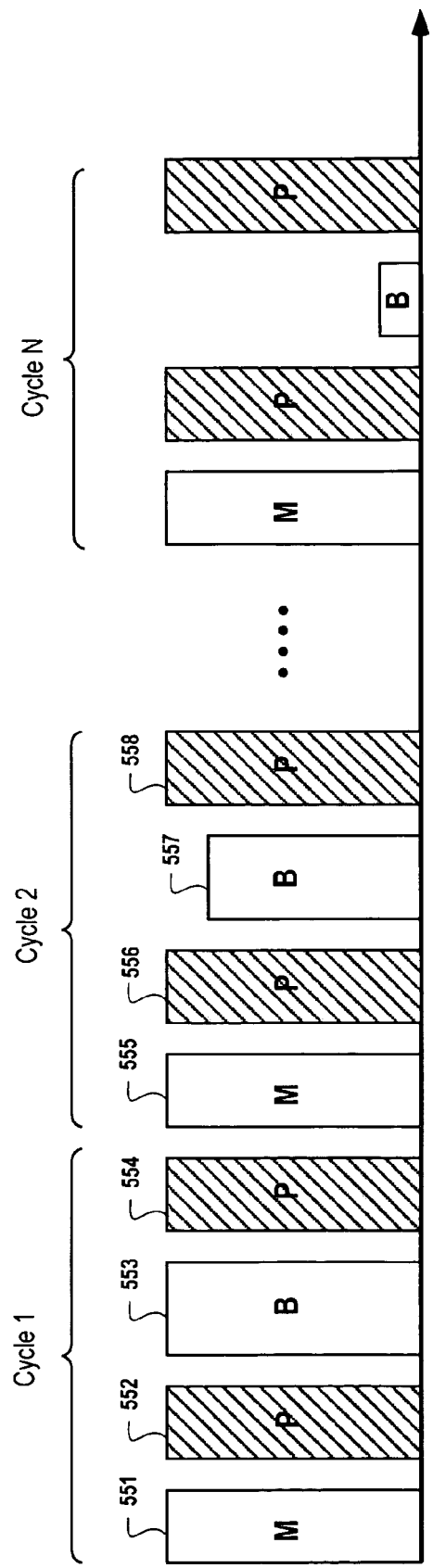
FIG. 5C shows another exemplary deposition pulse sequence of an ALD barrier layer with continuously decreasing nitrogen concentration with increase of film thickness.

FIG. 5C shows another embodiment of a deposition process that would yield a barrier layer with decreasing nitrogen content in the barrier layer with film thickness, as shown in FIG. 3C. In this embodiment, the M and P pulses stay the same through different deposition cycles. Reactant B is a nitrogen-containing compound. The pulse time to reactant B stays the same with different cycles. However, the concentration (or amount) of reactant B in the pulses of reactant B decreases with each deposition cycle. As shown in FIG. 5C, the concentration of reactant B in pulse 553 is higher than pulse 557. With decreasing concentration (or amount) of B with each deposition cycle, the nitrogen concentration decreases with film thickness. Similarly, the deposition cycles continue until cycle N when the target thickness has been reached.

Figure 5D:
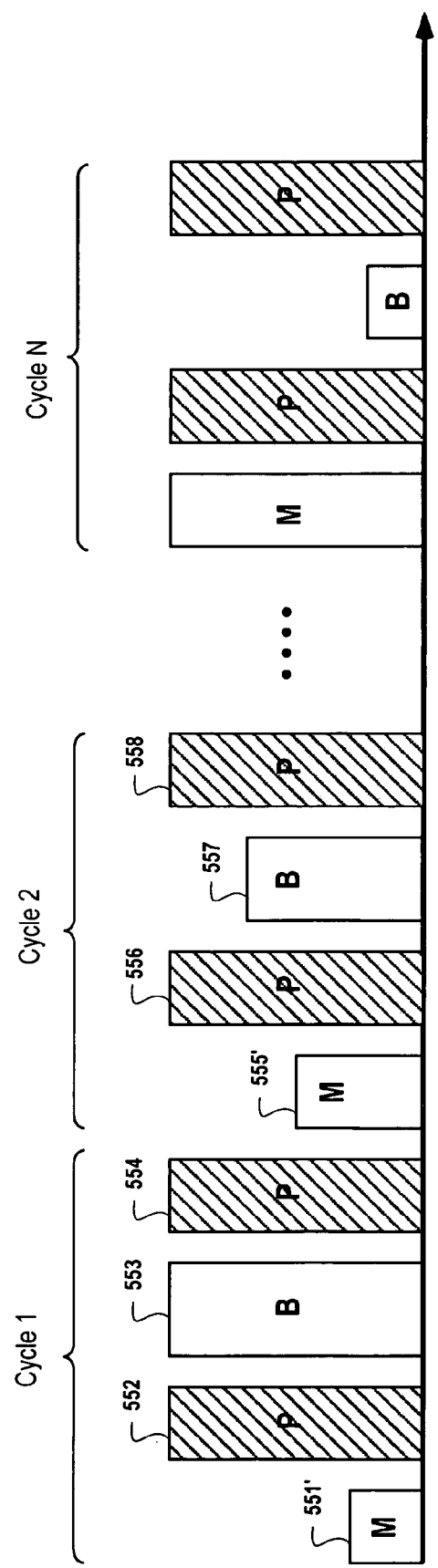
FIG. 5D shows another exemplary deposition pulse sequence of an ALD barrier layer with continuously decreasing nitrogen concentration with increase of film thickness.

Alternatively, the concentration of the barrier-metal-containing reactant M can be made to increase with cycles, while the concentration of the nitrogen-containing compound B is made to decrease with cycles, as shown in FIG. 5D. Such combination can also result in decrease of nitrogen concentration in the barrier layer with film thickness.

Figure 6A:
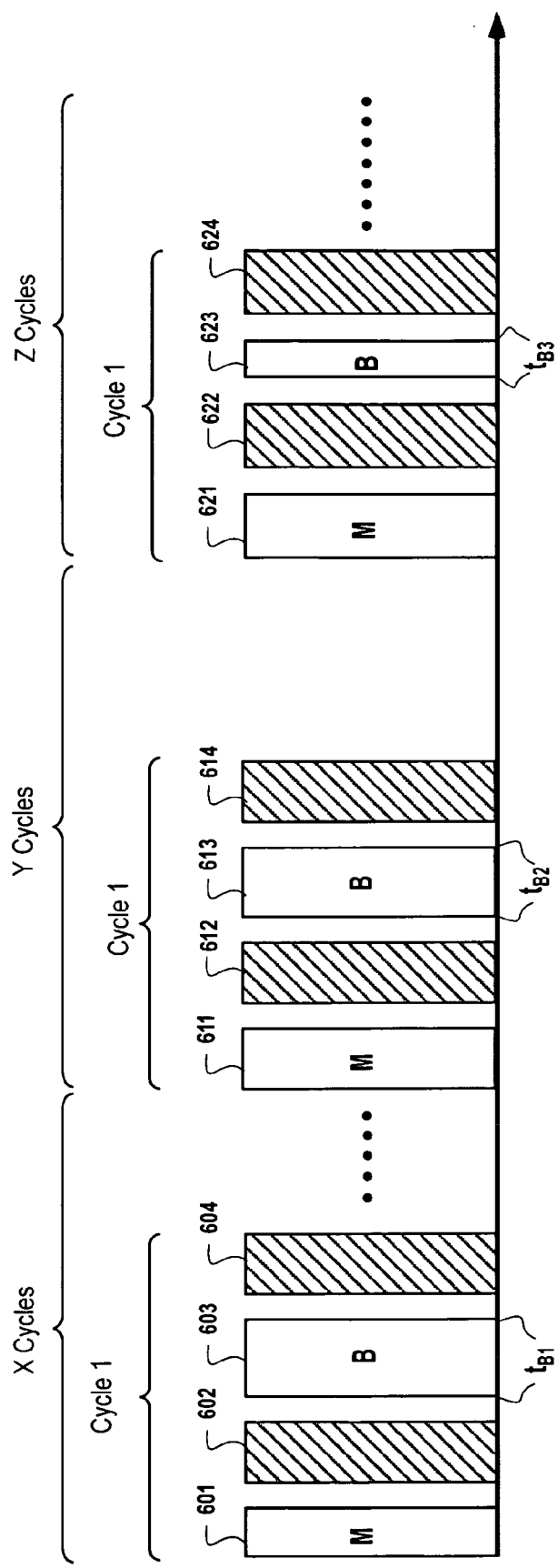
FIG. 6A shows an exemplary deposition pulse sequence of an ALD barrier layer with step-wise decreasing nitrogen concentration with increase of film thickness.

As shown in FIG. 3D, another way to create a barrier film with high concentration of nitrogen in the initial layer and low (or no) nitrogen concentration on the top surface is creating a barrier film with step-wise nitrogen concentration. FIG. 3D shows three concentration levels. However, other concentration levels are possible, as long as the nitrogen concentration decreases with film thickness. FIG. 6A shows an embodiment of pulses of reactants and purging gases as a function of time to achieve decreasing nitrogen content in the barrier layer as shown in FIG. 3D.

The deposition process starts by applying a pulse of barrier-metal-containing reactant (M) 601 on the substrate surface. Pulse 601 is followed by a pulse 602 of a purging gas (P) to remove excess barrier-metal-containing reactant 601 from the substrate surface. Afterwards, a pulse of reactant gas (B) is applied. Since the nitrogen content of the barrier metal layer decreases with film thickness, the reactant gas (B) used for pulse 603 should contain nitrogen. The reactant in pulse 603 react with the barrier-metal-containing reactant (M) on the substrate surface to form a metal nitride barrier layer, such as TaN, with concentration $C_1$ shown in FIG. 3D. The pulse duration of reactant B pulse 603 is $t_{B1}$. The examples of the nitrogen-containing gas include ammonia ($NH_3$), nitrogen ($N_2$), and nitrogen oxide (NO). Other types of nitrogen-containing gases described above are also possible. Pulses 601, 602, 603 and 604 constitute one cycle to deposit a barrier layer with nitrogen concentration at $C_1$ level. The cycles repeats until the film thickness reaches $t_1$ thickness (X cycles), which is shown in FIG. 3D.

The second type of cycle includes pulses 611, 612, 613, and 614 to deposit a barrier layer with $C_2$ nitrogen concentration. Pulse 611 is identical to pulse 601. Pulse 612 is identical to pulse 602. Pulse 614 is identical to pulse 604. Pulse 613 uses the same reactant as pulse 603, however, the duration $t_{B2}$ of pulse 613 is shorter than the duration $t_{B1}$ of pulse 603. The shorter pulse of the nitrogen-containing gas B makes the concentration of nitrogen in the barrier layer lower. The cycles repeat until the barrier layer reaches the thickness of $t_2$ (Y cycles). Afterwards, the third type of cycle includes pulse 621, 622, 623, and 624. The duration $T_{B3}$ of pulse 623 with reactant B is lower than duration $t_{B2}$ of pulse 613. The cycles repeat until the final barrier layer thickness is reached (Z cycles). At the end of Z cycles, the barrier layer reaches its targeted thickness. In one embodiment, the duration of the pulse with reactant B is zero second to make the top barrier surface metal-rich.

As described above, pulses with reactant B and purging gas P can be plasma enhanced. The plasma enhanced purging gas can densify the barrier layer and also can knock off the excess molecules attached to the barrier metal. In one embodiment, there is a final plasma treatment to further reduce surface compound to be more metal-rich. The reducing plasma can include gas, such as hydrogen or ammonia. The reducing plasma can include an inert gas, such as Ar, or He. This final plasma treatment can also densify the barrier layer. In another embodiment, after the deposition cycles in the ALD process chamber, the substrate can be moved to a PVD process chamber for depositing a thin barrier layer, which is called a barrier flash. For example, if the barrier metal is Ta, the process is called Ta flash. This allows the top barrier surface to be Ta, which adhere well to copper.

The pulsing concentration and duration of the deposition reactants and purging gas of FIG. 6A is similar to FIG. 5A, except the cycles of FIG. 5A are not repeated, while the cycles of FIG. 6A are repeated. Similarly, the concept described in FIG. 5B, with both the durations of barrier-metal-containing reactant M and nitrogen-containing reactant B varying at the same time, can be applied to deposit barrier layer with step-wise-varying nitrogen concentration. Each cycle described in FIG. 5B is repeated in a manner shown in FIG. 6A to achieve step-wise variation in nitrogen concentration.

Figure 6B:
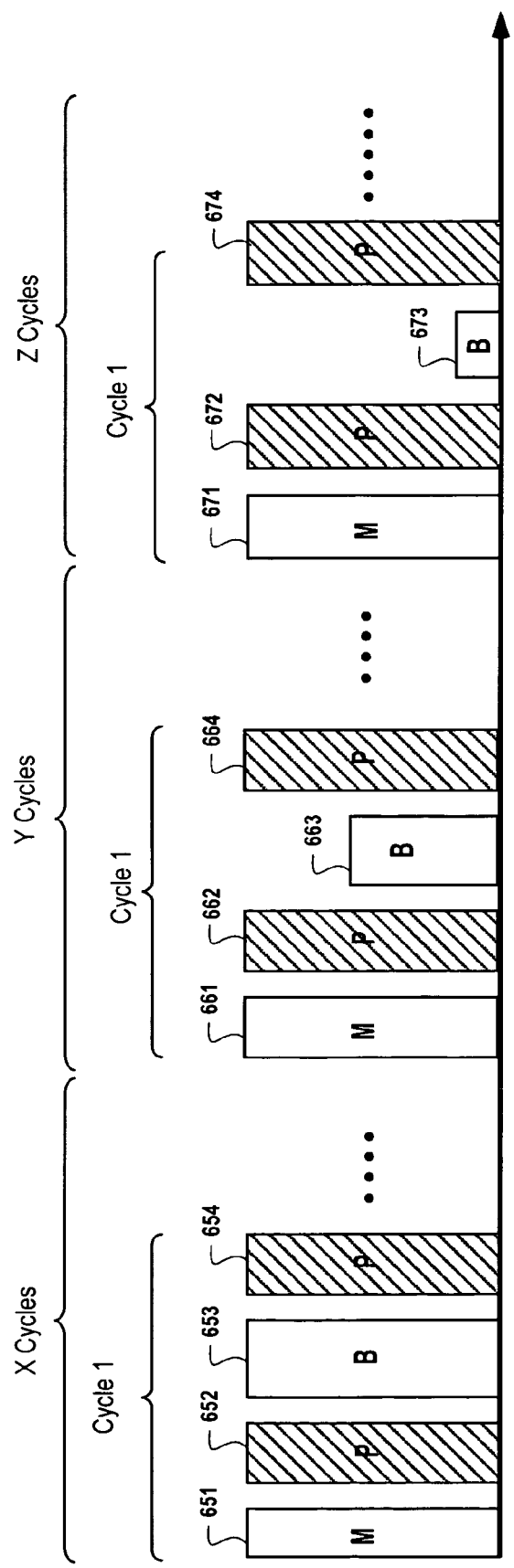
FIG. 6B shows another exemplary deposition pulse sequence of an ALD barrier layer with step-wise decreasing nitrogen concentration with increase of film thickness.

FIG. 6B shows another embodiment of a deposition process that would yield a barrier layer with decreasing nitrogen content in the barrier layer with increase of film thickness, as shown in FIG. 3D. In this embodiment, the pulse time to reactant B stays the same with different cycles. However, the concentration (or amount) of reactant B in the pulses of reactant B decreases with each cycle. As shown in FIG. 6B, the concentration of reactant B in pulse 653 is higher than pulse 663, which is higher than pulse 673. Similarly, each deposition cycle continues until the target thickness has been reached. The decreasing concentration of reactant B, which contains nitrogen, in the three types of deposition cycles allows the deposited barrier layer to have decreasing nitrogen concentration with increase of film thickness, as shown in FIG. 3D.

As described above for repeating cycles in FIG. 5B to deposit barrier layer with step-wise-varying nitrogen concentration, the concept described in FIG. 5D, with both the concentrations of barrier-metal-containing reactant M and nitrogen-containing reactant B varying at the same time, can be applied to deposit barrier layer with step-wise-varying nitrogen concentration. Each cycle described in FIG. 5D is repeated in a manner shown in FIG. 6A to achieve step-wise variation in nitrogen concentration.

Figure 7A:
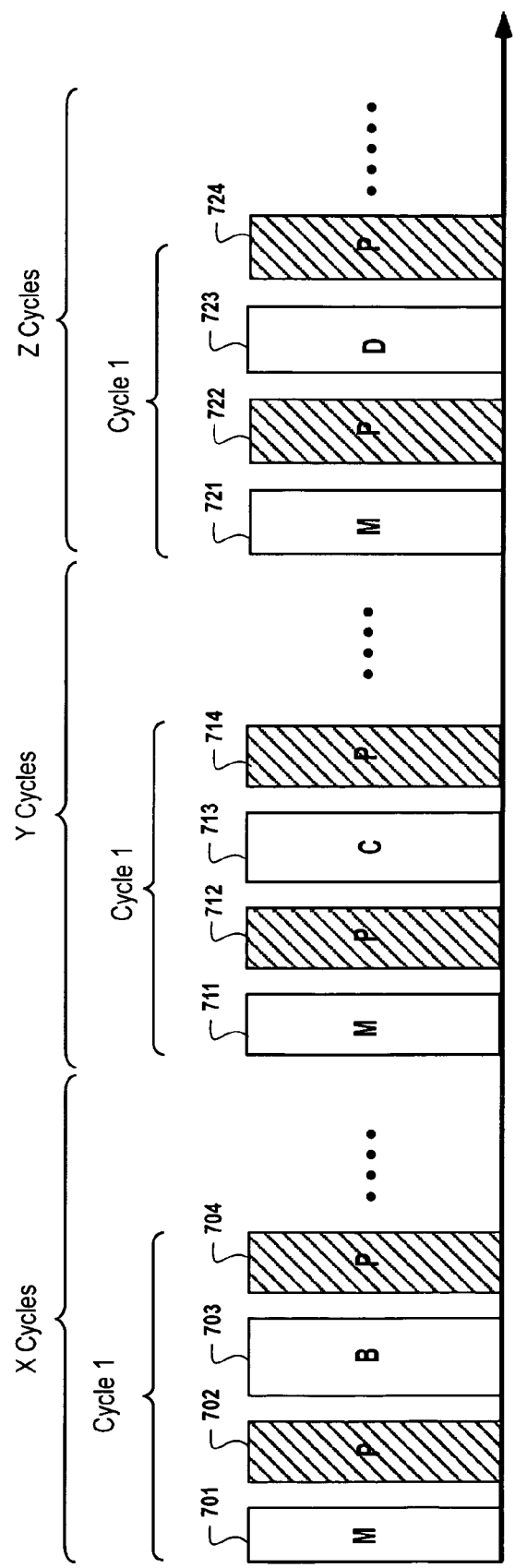
FIG. 7A shows an exemplary deposition pulse sequence of an ALD barrier layer with step-wise decreasing nitrogen concentration with increase of film thickness.

FIG. 7A shows another embodiment of a deposition process that would yield a barrier layer with decreasing nitrogen content in the barrier layer with increase of film thickness, as shown in FIG. 3D. The deposition process starts by applying a pulse of barrier-metal-containing reactant (M) 701 on the substrate surface. Pulse 701 is followed by a pulse 702 of a purging gas (P) to remove excess barrier-metal-containing reactant 701 from the substrate surface. Afterwards, a pulse of reactant gas (B) is applied. Since the nitrogen content of the barrier metal layer decreases with film thickness, the reactant gas (B) used for pulse 703 should contain nitrogen. The reactant (B) in pulse 703 react with the barrier-metal-containing reactant (M) on the substrate surface to form a metal nitride barrier layer, such as TaN, with nitrogen concentration at C1 as shown in FIG. 3D. Pulses 701, 702, 703 and 704 constitute one cycle. The cycles repeats until the film thickness reaches t1 thickness (X cycles), which is shown in FIG. 3D.

The second type of cycle includes pulses 711, 712, 713, and 714 to deposit a barrier layer with C2 nitrogen concentration. Pulse 711 is identical to pulse 701. Pulse 712 is identical to pulse 702. Pulse 714 is identical to pulse 704. Pulse 713 uses a reactant C that would react with the barrier-metal-containing reactant M to produce a barrier layer with less nitrogen content C2, which is less than C1 concentration resulting from reacting M with reactant B. The cycles of 711, 712, 713, and 714 pulses repeat until the film thickness reaches t2 thickness, which is shown in FIG. 3D. The third type of cycle includes pulses 721, 722, 723, and 724 to deposit a barrier layer with C3 nitrogen concentration. Pulse 721 is identical to pulses 701 and 711. Pulse 722 is identical to pulses 702 and 712. Pulse 724 is identical to pulses 704 and 714. Pulse 723 uses a reactant D that would react with the barrier-metal-containing reactant M to produce a barrier layer with less nitrogen content C3, which is less than C2 concentration resulting from reacting M with reactant C. The cycles of 721, 722, 723, and 724 pulses repeat until the film thickness reaches t3 thickness, which is shown in FIG. 3D. The pulse time and concentration for B, C, and D can be the same or varied. B, C, D processes can be thermal or plasma enhanced. Similarly, the process step of using purging gas P can be thermal or plasma enhanced.

As described above, pulses with reactant B and purging gas P can be plasma enhanced. The plasma enhanced purging gas can densify the barrier layer and also can knock off the excess molecules attached to the barrier metal. In one embodiment, there is a final plasma treatment to further reduce surface compound to be more metal-rich. The reducing plasma can include gas, such as hydrogen or ammonia. The reducing plasma can include an inert gas, such as Ar, or He. This final plasma treatment can also densify the barrier layer. In another embodiment, after the deposition cycles in the ALD process chamber, the substrate can be moved to a PVD process chamber for depositing a thin barrier layer, which is called a barrier flash. For example, if the barrier metal is Ta, the process is called Ta flash. This allows the top barrier surface to be Ta, which adhere well to copper.

An alternative embodiment of the embodiment shown in FIG. 7A is increasing the duration or concentration of the barrier-metal containing reactant M 701, 711, 721, to react with B, C and D. The combination can also result in step-wise decrease in nitrogen concentration in the barrier layer.

Figure 7B:
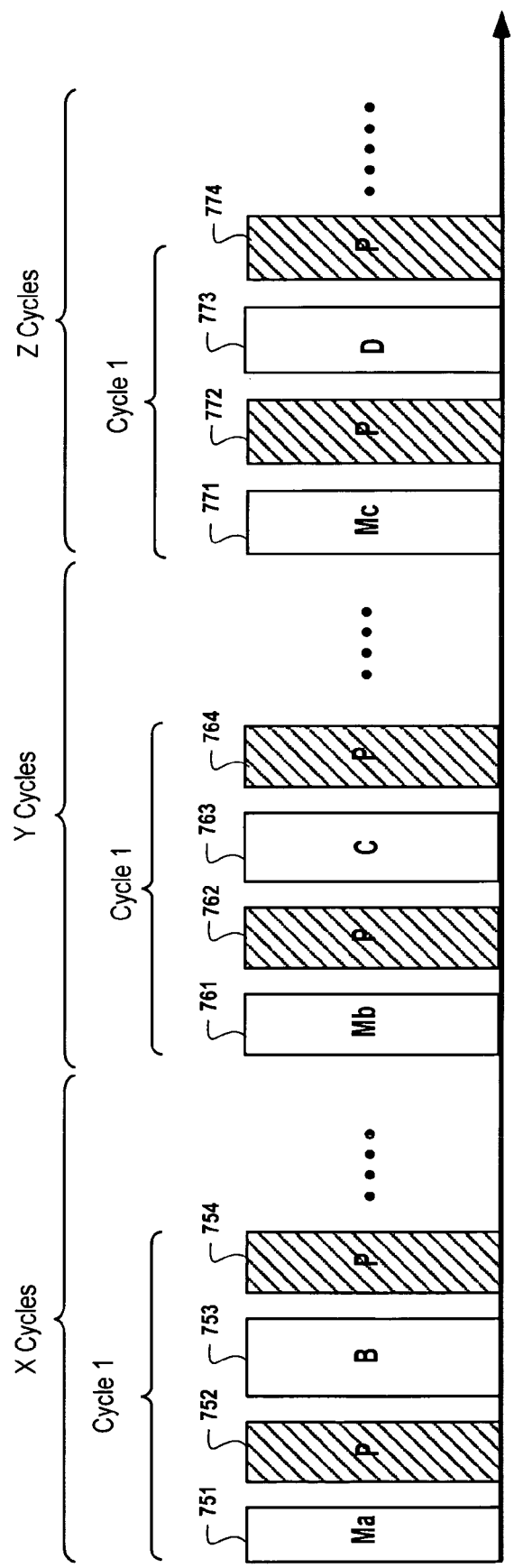
FIG. 7B shows another exemplary deposition pulse sequence of an ALD barrier layer with step-wise decreasing nitrogen concentration with increase of film thickness.

FIG. 7B shows another embodiment of a deposition process that would yield a barrier layer with decreasing nitrogen content in the barrier layer with increase of film thickness, as shown in FIG. 3D. The deposition process starts by applying a pulse of barrier-metal-containing reactant (Ma) 751 on the substrate surface. Pulse 751 is followed by a pulse 752 of a purging gas (P) to remove excess barrier-metal-containing reactant 751 from the substrate surface. Afterwards, a pulse of reactant gas (B) is applied. Since the nitrogen content of the barrier metal layer decreases with film thickness, the reactant gas (B) used for pulse 753 should contain nitrogen. The reactant in pulse 753 reacts with the barrier-metal-containing reactant (Ma) on the substrate surface to form a metal nitride bather layer, such as TaN. Pulses 751, 752, 753 and 754 constitute one cycle to deposit a bather layer with nitrogen concentration at C1 level. The cycles repeats until the film thickness reaches t1 thickness (X cycles), which is shown in FIG. 3D.

The second type of cycle includes pulses 761, 762, 763, and 764 to deposit a barrier layer with C2 nitrogen concentration. Pulse 761 uses a barrier-metal-containing reactant Mb that is different from Ma in pulse 751. Pulse 762 is identical to pulse 752. Pulse 764 is identical to pulse 754. Pulse 763 uses a reactant C that would react with the barrier-metal-containing reactant Mb to produce a barrier layer with less nitrogen content C2, which is less than C1 concentration resulting from reacting Ma with reactant B. The cycles of 761, 762, 763, and 764 pulses repeat until the film thickness reaches t2 thickness (Y cycles), which is shown in FIG. 3D. The third type of cycle includes pulses 771, 772, 773, and 774 to deposit a barrier layer with C3 nitrogen concentration. Pulse 771 uses a barrier-metal-containing reactant Mc that is different from Ma in pulse 751 and Mb in pulse 761. Pulse 772 is identical to pulses 752 and 762. Pulse 774 is identical to pulses 754 and 764. Pulse 773 uses a reactant D that would react with the barrier-metal-containing reactant Mc to produce a barrier layer with less nitrogen content C3, which is less than C2 concentration resulting from reacting Mb with reactant C. The cycles of 771, 772, 773, and 774 pulses repeat until the film thickness reaches t3 thickness (Z cycles), which is shown in FIG. 3D. The pulse time and concentration for B, C, and D can be the same or varied. B, C, D processes can be thermal or plasma enhanced. Similarly, the process step of using purging gas P can be thermal or plasma enhanced.

Examples of barrier-metal-containing reactant, Ma, Mb, and Mc, for barrier metal such as tantalum include but are not limited to pentaethylmethylamino-tantalum (PEMAT; $Ta(NC_2H_5CH_3)_5$), pentadiethylamino-tantalum (PDEAT, $Ta[N(C_2H_5)_2]_5$), pentadimethylamino-tantalum (PDMAT, $Ta[N(CH_3)_2]_5$), and any and all of derivatives of PEMAT, PDEAT, or PDMAT. Other tantalum containing precursors include without limitation tertbutylimido-tris(diethylamido)-tantalum (TBTDET), tertbutylimido-tris(dimethylamido)-tantalum (TBTDMT), and tertbutylimido-tris(ethylmethylamido)-tantalum (TBTEMT), and all of derivatives of TBTDET, TBTDMT, and TBTEMT. Additionally, other tantalum containing precursors include without limitation tantalum halides for example $TaX_5$ where X is fluorine (F), bromine (Br) or chlorine (Cl), and derivatives thereof. Examples of reactants B, C, and D include ammonia ($NH_3$), $N_2$, and NO. Other N-containing precursors gases may be used including but not limited to $N_xH_y$ for x and y integers (e.g., $N_2H_4$), $N_2$ plasma source, $NH_2N(CH_3)_2$, among others.

As described above, pulses with reactant B and purging gas P can be plasma enhanced. The plasma enhanced purging gas can densify the barrier layer and also can knock off the excess molecules attached to the barrier metal. In one embodiment, there is a final plasma treatment to further reduce surface compound to be more metal-rich. The reducing plasma can include gas, such as hydrogen or ammonia. The reducing plasma can include an inert gas, such as Ar, or He. This final plasma treatment can also densify the barrier layer. In another embodiment, after the deposition cycles in the ALD process chamber, the substrate can be moved to a PVD process chamber for depositing a thin barrier layer, which is called a barrier flash. For example, if the barrier metal is Ta, the process is called Ta flash. This allows the top barrier surface to be Ta, which adhere well to copper.

Figure 7C:
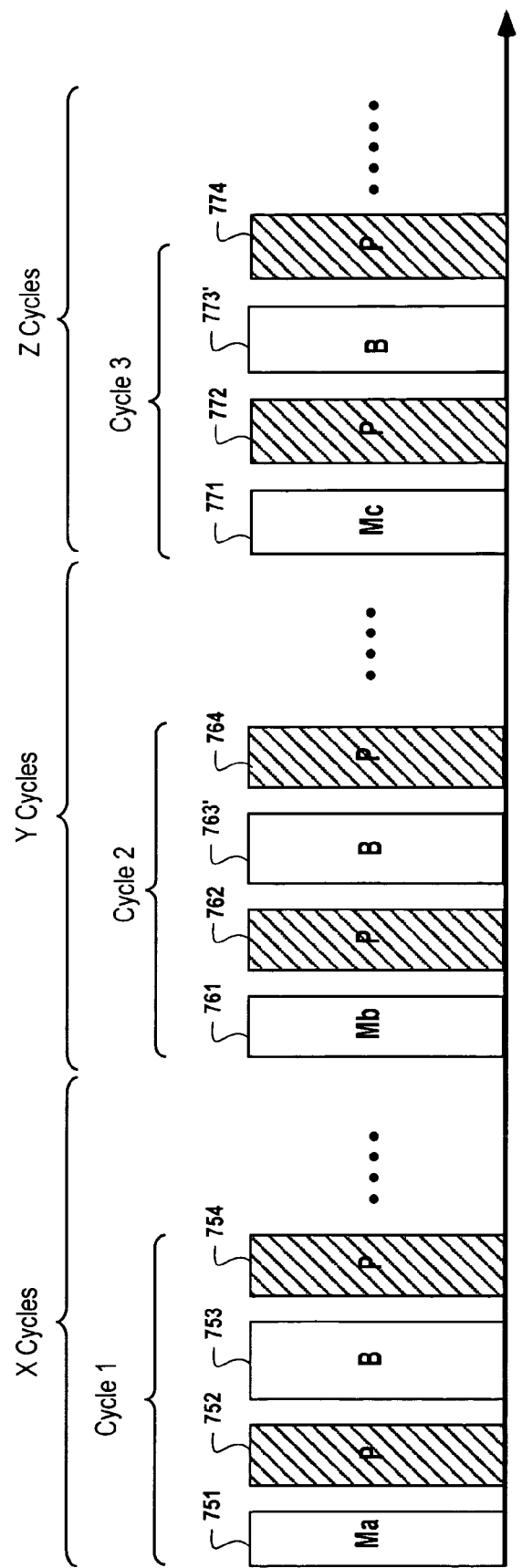
FIG. 7C shows another exemplary deposition pulse sequence of an ALD barrier layer with step-wise decreasing nitrogen concentration with increase of film thickness.

An alternative embodiment, as shown in FIG. 7C, of the embodiment shown in FIG. 7B is using one single nitrogen-containing reactant B in all deposition cycles of FIG. 7B. Ma reacts with B to deposit a barrier layer with concentration at C1 level after X cycles. Mb reacts with B to deposit a barrier layer with concentration at C2' (lower than C1) level after Y cycles. Mc reacts with B to deposit a barrier layer with concentration C3' (lower than C2') level after Z cycles.

Figure 8A:
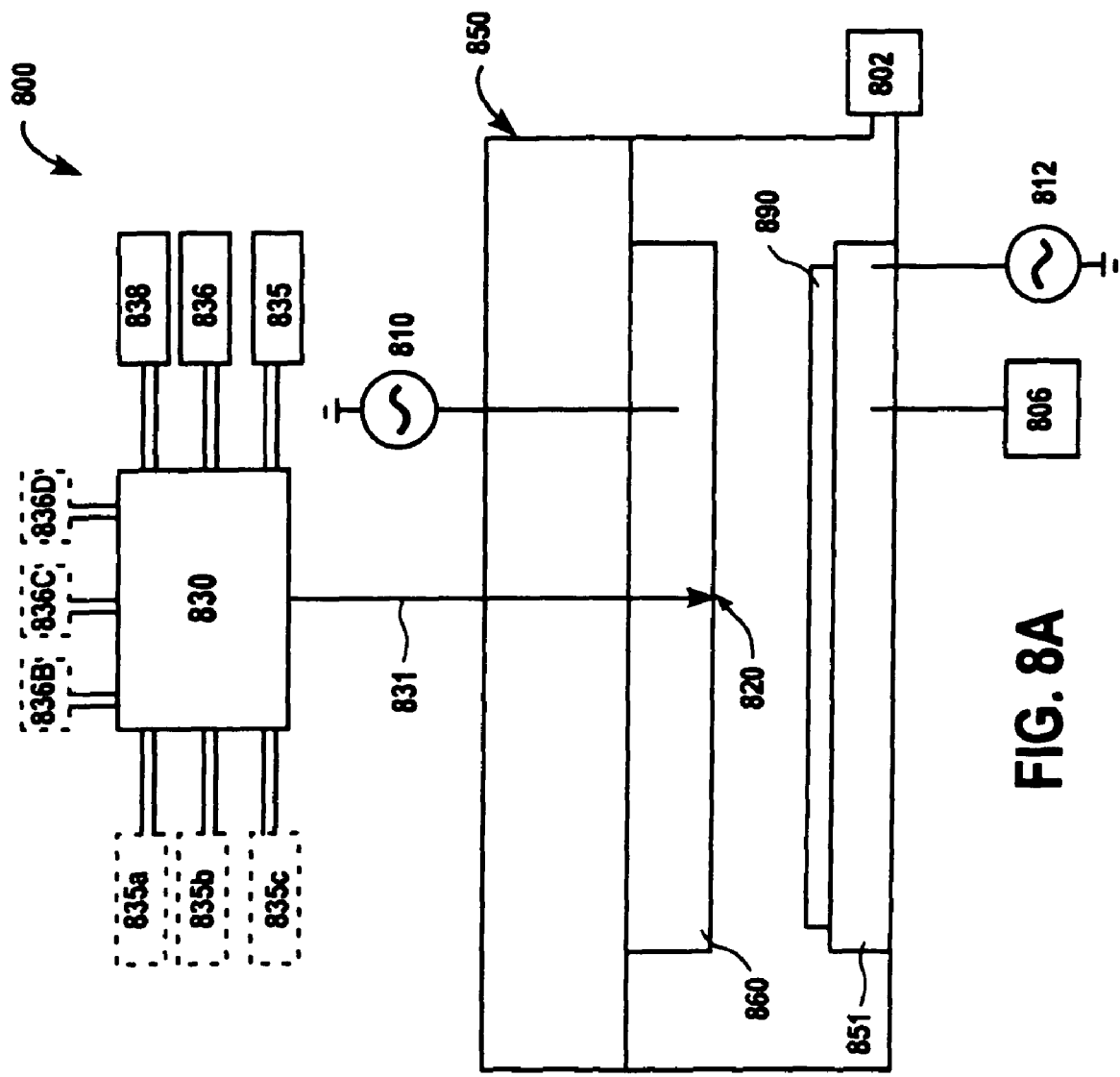
FIG. 8A shows an exemplary ALD deposition system.

FIG. 8A depicts a schematic illustration of an exemplary wafer processing system 800 that can be used to form one or more barrier layers in accordance with aspects of the present invention described herein. System 800 comprises process chamber 850, gas panel 830, along with other hardware components such as power supply 806 and vacuum pump 802. For purposes of clarity, salient features of process chamber 850 are briefly described below.

Process chamber 850 generally houses a support pedestal 851, which is used to support a substrate such as a semiconductor wafer 890 within process chamber 850. Depending on process requirements, semiconductor wafer 890 can be heated to some desired temperature or within some desired temperature range prior to layer formation with heating power from power supply 806. Wafer 890 may be maintained within a desired process temperature range of, for example, about 100° C. to about 400° C., preferably between about 150° C. to about 350° C.

Vacuum pump 802 is used to evacuate process gases from process chamber 850 and to help maintain a desired pressure or desired pressure within a pressure range inside chamber 850. Orifice 820 through a wall of chamber 850 is used to introduce process gases into process chamber 850. Sizing of orifice 820 conventionally depends on the size of process chamber 850.

Gas pipe 831 is coupled to gas panel 830 to provide a process gas from three or more gas sources 835, 836, 838 to process chamber 850 through gap pipe 831. Reactant sources 835, and 836 may store precursors in a liquid phase at room temperature, which are later heated when in gas panel 830 to convert them to a vapor-gas phase for introduction into chamber 850. Gas panel 830 is further configured to receive and then provide a purge gas from purge gas source 838 to process chamber 850. In one embodiment, reactant source 835 stores M precursors, while reactant source 836 stores reactant B described above. For the embodiment with more than one M precursors (Ma, Mb, and Mc), multiple reactant sources 835 (835a, 835b, and 835c) can be used. Similarly, for the embodiment, with more than one B reactant (B, C, and D), multiple reactant sources 836 (836B, 836C, and 836D) can be used.

Figure 8B:
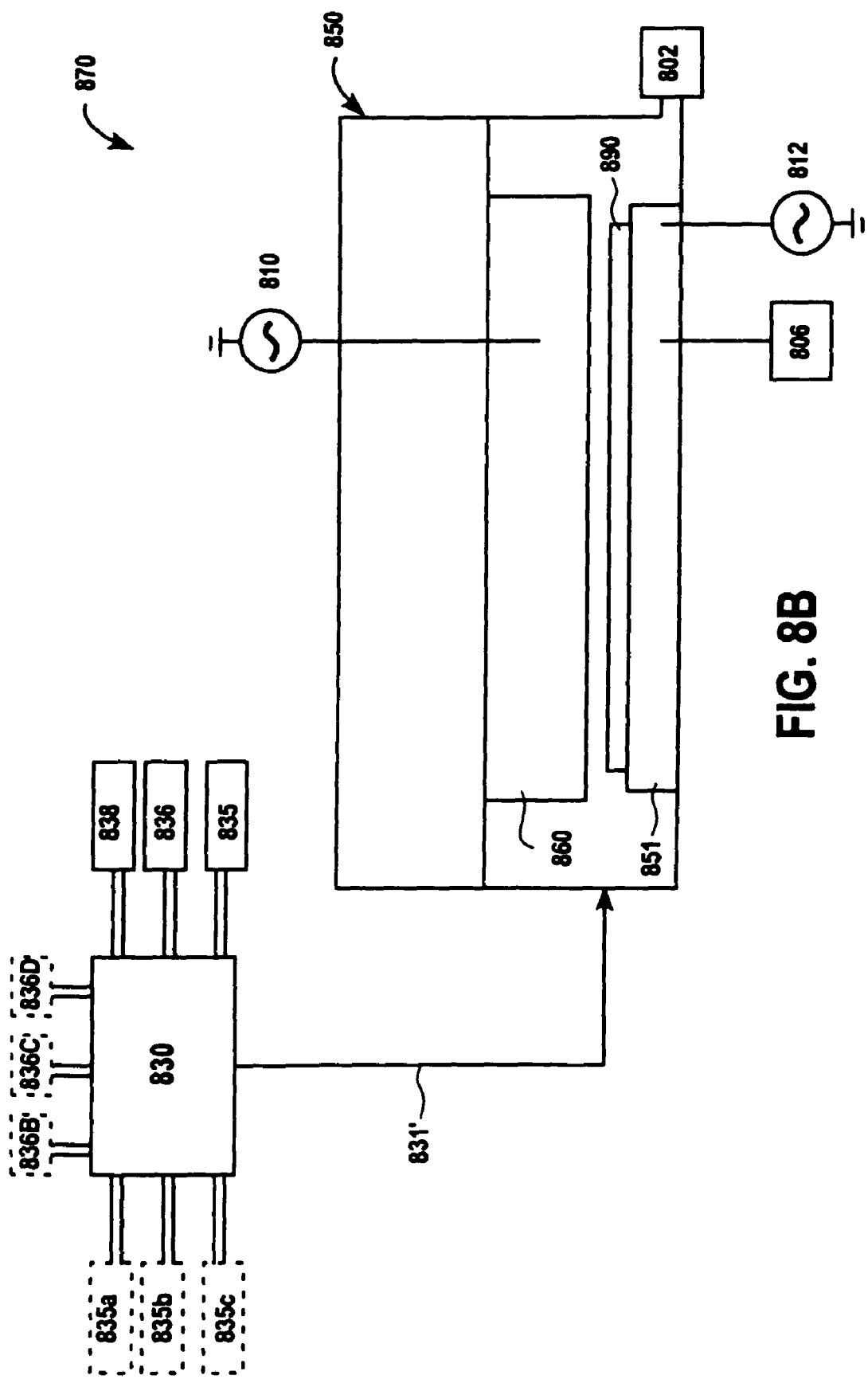
FIG. 8B shows another exemplary ALD deposition system.

Alternatively, the reactive gases can be injected from the side of the process chamber. FIG. 8B depicts a schematic illustration of another exemplary wafer processing system 870 that can be used to form one or more barrier layers in accordance with aspects of the present invention described herein. In this embodiment, the gas pipe 831' is coupled to gas panel 830 to provide a process gas through the side of the process chamber 850 to the surface of substrate 890. In one embodiment, the reactive gas(es) is introduced to the surface of the substrate 890 in laminar flow.

As described above, during or after forming one or more of the barrier layer, substrate structure 890 may be subjected to plasma process gas for reaction or for plasma treatment. While not wishing to be bound by theory, the plasma treatment, such as an Ar sputtering, can help remove the organic compound attached to the barrier metal, such as Ta, after the barrier metal is chemisorbed on the substrate surface. The organic compound(s) attached to the barrier metal is part of the barrier metal precursor. The plasma treatment can help remove impurity from the barrier layer. The plasma treatment can also improve the quality and density of the barrier layer.

Referring to FIG. 8A, there is one or more RF power supplies 810 and 812. RF power supply 810 is coupled to a showerhead 860.

Showerhead 860 and wafer support pedestal 851 provide in part spaced apart electrodes. An electric field may be generated between these electrodes to ignite a process gas introduced into chamber 850 to provide a plasma. It will be appreciated that other non-chemically reactive gases with respect to the metallic barrier layer may be used for physically displacing nitrogen from metallic barrier layer, including but not limited to neon (Ne), xenon (Xe), helium (He), and hydrogen ($H_2$). Generally, for a plasma-gas that does not chemically react with a tantalum-nitride film, it is desirable to have a plasma-gas atom or molecule with an atomic-mass closer to N than to Ta in order to have preferential sputtering of the N. However, a chemically reactive process may be used where a gas is selected which preferentially reacts for removal of N while leaving Ta.

The concept described in the various embodiments above can also be used to deposit barrier layer with increasing or decreasing concentration of a compound in the barrier layer. For example, it might be desirable to have increasing nitrogen concentration in the barrier layer with increase of film thickness for other applications. Under the circumstance, the duration and/or concentration of B reactant are increased with deposition cycle, instead of decreasing as described above. The compound with increasing or decreasing concentration does not have to be nitrogen. Other applicable compounds can benefit from the concept. The concept applies to any ALD deposition that requires two reactants.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method of depositing a metallic barrier layer to line an etched interconnect structure in an atomic layer deposition system, comprising: depositing the metallic barrier layer to line the etched interconnect structure using atomic layer deposition, the etched interconnect structure being etched into a dielectric layer, wherein a nitrogen concentration of the metallic barrier layer decreases with an increasing film thickness, and wherein the nitrogen concentration of the metallic barrier layer is changed by varying a chemical composition of one or more process gases in a sequential pulsing of process gases, by varying durations of the sequential pulsing of process gases, or a combination of both, such that the nitrogen concentration of the metallic barrier layer is highest where the metallic barrier layer is in contact with the dielectric layer; and forming a copper layer over the metallic barrier layer, such that the nitrogen concentration of the metallic barrier layer is lowest where the metallic barrier layer is in contact with the copper layer.

2. The method of claim 1, wherein the metallic barrier layer is deposited by performing sequential pulsing of a barrier metal precursor, a purging gas, a nitrogen-containing gas and the purging gas, wherein the nitrogen-containing gas reacts with the barrier metal precursor to form the metallic barrier layer.

3. The method of claim 2, wherein a duration of the nitrogen-containing gas decreases with each cycle of the sequential pulsing.

4. The method of claim 2, wherein the nitrogen-containing gas is plasmarized.

5. The method of claim 2, wherein the purging gas is plasmarized.

6. The method of claim 2, wherein the barrier metal precursor is selected from the list containing pentaethylmethylamino-tantalum (PEMAT), pentadiethylamino-tantalum (PDEAT), pentadimethylamino-tantalum (PDMAT), tertbutylimido-tris(diethylamido)-tantalum (TBTDET), tertbutylimido-tris(dimethylamido)-tantalum (TBTDMT), tertbutylimido-tris(ethylmethylamido)-tantalum (TBTEMT), and tantalum halides $TaX_5$, wherein X is fluorine (F), bromine (Br) or chlorine (CO, and any and all derivatives thereof.

7. The method of claim 2, wherein purging gas is one of helium (He), neon (Ne), argon (Ar), hydrogen ($H_2$), nitrogen ($N_2$), and combinations thereof.

8. The method of claim 2, wherein the nitrogen-containing gas is selected from the list containing ammonia ($NH_3$), $N_2$, NO, and $N_xH_y$, wherein x and y are integers.

9. The method of claim 1, wherein the barrier metal in the barrier layer is selected from the group consisting of tantalum (Ta), titanium (Ti), tungsten (W), zirconium (Zr), hafnium (Hf), molybdenum (Mo), niobium (Nb), vanadium (V), ruthenium (Ru) and chromium (Cr).

10. The method of claim 1, wherein the metallic barrier layer is deposited by performing sequential pulsing of a barrier metal precursor, a purging gas, a first nitrogen-containing gas and the purging gas, wherein the first nitrogen-containing gas reacts with the barrier metal precursor to form a first sub-layer of the metallic barrier layer with a first nitrogen concentration.

11. The method of claim 10, wherein deposition of the first sub-layer of the metallic barrier layer is followed by performing sequential pulsing of the barrier metal precursor, the purging gas, a second nitrogen-containing gas and the purging gas, wherein the second nitrogen-containing gas reacts with the barrier metal precursor to form a second sub-layer of the metallic barrier layer with a second nitrogen concentration and the second nitrogen concentration is lower than the first nitrogen concentration.

12. The method of claim 1, wherein the metallic barrier layer is deposited by performing sequential pulsing of a first barrier metal precursor, a purging gas, a nitrogen-containing gas and the purging gas, wherein the nitrogen-containing gas reacts with the first barrier metal precursor to form a first sub-layer of the metallic barrier layer with a first nitrogen concentration.

13. The method of claim 12, wherein deposition of the first sub-layer of the metallic barrier layer is followed by performing sequential pulsing of a second barrier metal precursor, a purging gas, a nitrogen-containing reactant and the purging gas, wherein the nitrogen-containing gas reacts with the second barrier metal precursor to form a second sub-layer of the metallic barrier layer with a second nitrogen concentration, and wherein the second nitrogen concentration is lower than the first nitrogen concentration.

14. The method of claim 1, wherein the metallic barrier layer is deposited by performing sequential pulsing of a first barrier metal precursor, a purging gas, a first nitrogen-containing gas and the purging gas, wherein the first nitrogen-containing gas reacts with the first barrier metal precursor to form a first sub-layer of the metallic barrier layer with a first nitrogen concentration.

15. The method of claim 14, wherein deposition of the first sub-layer of the metallic barrier layer is followed by performing sequential pulsing of a second barrier metal precursor, a purging gas, a second nitrogen-containing reactant and the purging gas, wherein the second nitrogen-containing gas reacts with the second barrier metal precursor to form a second sub-layer of the metallic barrier layer with a second nitrogen concentration, and wherein the second nitrogen concentration is lower than the first nitrogen concentration.

16. A method of depositing a metallic barrier layer to line an etched interconnect structure in an atomic layer deposition system, comprising:
depositing the metallic barrier layer to line the etched interconnect structure using atomic layer deposition, the etched interconnect structure being etched into a dielectric layer, wherein a nitrogen concentration of the metallic barrier layer decreases step-wise with an increasing film thickness, and wherein the nitrogen concentration of the metallic barrier layer is changed by varying a chemical composition of one or more process gases in a sequential pulsing of process gases, by varying durations of sequential pulsing of process gases, or a combination of both, such that the nitrogen concentration of the metallic barrier layer is highest where the metallic barrier layer is in contact with the dielectric layer; and
forming a copper layer over the metallic barrier layer, such that the nitrogen concentration of the metallic barrier layer is lowest where the metallic barrier layer is in contact with the copper layer.

17. The method of claim 16, wherein the metallic barrier layer is deposited by performing a plurality of cycles of sequential pulsing of a barrier metal precursor, a purging gas, a first nitrogen-containing gas with a first duration, and the purging gas, wherein the first nitrogen-containing gas with the first duration reacts with the barrier metal precursor to form a first sub-layer of the metallic barrier layer with a first nitrogen concentration.

18. The method of claim 17, wherein deposition of the first sub-layer of the metallic barrier layer is followed by performing another plurality of cycles of sequential pulsing of the barrier metal precursor, the purging gas, a second nitrogen-containing gas with a second duration, and the purging gas, wherein the second nitrogen-containing gas with the second duration reacts with the barrier metal precursor to form a second sub-layer of the metallic barrier layer with a second nitrogen concentration.

19. The method of 18, wherein the second duration is shorter than the first duration.

20. The method of claim 17, wherein the metallic barrier layer is deposited by performing a plurality of cycles of sequential pulsing of a barrier metal precursor, a purging gas, a first nitrogen-containing gas and the purging gas, wherein the first nitrogen-containing gas reacts with the barrier metal precursor to form a first sub-layer of the metallic barrier layer with a first nitrogen concentration.

21. The method of claim 20, wherein deposition of the first sub-layer of the metallic barrier layer is followed by performing a plurality of cycles of sequential pulsing of the barrier metal precursor, the purging gas, a second nitrogen-containing gas and the purging gas, wherein the second nitrogen-containing gas reacts with the barrier metal precursor to form a second sub-layer of the metallic barrier layer with a second nitrogen concentration and the second nitrogen concentration is lower than the first nitrogen concentration.

22. The method of claim 16, wherein the metallic barrier layer is deposited by performing a plurality of cycles of sequential pulsing of a first barrier metal precursor, a purging gas, a nitrogen-containing gas and the purging gas, wherein the nitrogen-containing gas reacts with the first barrier metal precursor to form a first sub-layer of the metallic barrier layer with a first nitrogen concentration.

23. The method of claim 22, wherein deposition of the first sub-layer of the metallic barrier layer is followed by performing a plurality of cycles of sequential pulsing of a second barrier metal precursor, a purging gas, a nitrogen-containing reactant and the purging gas, wherein the nitrogen-containing gas reacts with the second barrier metal precursor to form a second sub-layer of the metallic barrier layer with a second nitrogen concentration, and wherein the second nitrogen concentration is lower than the first nitrogen concentration.

24. A method of depositing a metallic barrier layer to line an etched interconnect structure in an atomic layer deposition system, comprising:

depositing the metallic barrier layer to line the etched interconnect structure using atomic layer deposition, the etched interconnect structure being etched into a dielectric layer, wherein a nitrogen concentration of the metallic barrier layer decreases with an increasing film thickness, wherein the metallic barrier layer is deposited by performing sequential pulsing of a barrier metal precursor, a purging gas, a nitrogen-containing gas and the purging gas, wherein the nitrogen-containing gas reacts with the barrier metal precursor to form the metallic barrier layer, and wherein the nitrogen concentration of the metallic barrier layer is changed by varying the amount of barrier metal precursor during the sequential pulsing, such that the nitrogen concentration of the metallic barrier layer is highest where the metallic barrier layer is in contact with the dielectric layer; and forming a copper layer over the metallic barrier layer, such that the nitrogen concentration of the metallic barrier layer is lowest where the metallic barrier layer is in contact with the copper layer.

25. The method of claim 24, wherein the barrier metal in the barrier layer is selected from the group consisting of tantalum (Ta), titanium (Ti), tungsten (W), zirconium (Zr), hafnium (Hf), molybdenum (Mo), niobium (Nb), vanadium (V), ruthenium (Ru) and chromium (Cr).

26. The method of claim 24, wherein the barrier metal precursor is selected from the list containing pentaethylmethylamino-tantalum (PEMAT), pentadiethylamino-tantalum (PDEAT), pentadimethylamino-tantalum (PDMAT), tertbutylimido-tris(diethylamido)-tantalum (TBTDET), tertbutylimido-tris(dimethylamido)-tantalum (TBTDMT), tertbutylimido-tris(ethylmethylamido)-tantalum (TBTEMT), and tantalum halides $TaX_5$, wherein X is fluorine (F), bromine (Br) or chlorine (Cl), and any and all derivatives thereof.

* * * * *